United States Patent
Aoyama et al.

(10) Patent No.: US 8,658,520 B2
(45) Date of Patent: Feb. 25, 2014

(54) METHOD OF MANUFACTURING SEMICONDUCTOR DEVICE

(75) Inventors: Tomonori Aoyama, Yokohama (JP); Kiyotaka Miyano, Tokyo (JP); Hiroshi Nakazawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 170 days.

(21) Appl. No.: 13/415,628

(22) Filed: Mar. 8, 2012

(65) Prior Publication Data

US 2013/0023102 A1 Jan. 24, 2013

(30) Foreign Application Priority Data

Jul. 19, 2011 (JP) .................... 2011-158052

(51) Int. Cl.
 *H01L 21/36* (2006.01)
 *H01L 21/20* (2006.01)
(52) U.S. Cl.
 USPC .......... 438/482; 438/301; 438/486; 438/487; 438/682; 257/E21.09; 257/E21.409
(58) Field of Classification Search
 None
 See application file for complete search history.

(56) References Cited

U.S. PATENT DOCUMENTS

| 5,529,937 | A | * | 6/1996 | Zhang et al. | 438/471 |
| 6,316,123 | B1 | * | 11/2001 | Lee et al. | 428/641 |
| 7,238,557 | B2 | * | 7/2007 | Hayakawa | 438/161 |
| 2011/0008952 | A1 | | 1/2011 | Aoyama | |
| 2011/0111580 | A1 | | 5/2011 | Aoyama et al. | |

FOREIGN PATENT DOCUMENTS

| JP | 2002-141504 | 5/2002 |
| JP | 2006-351581 | 12/2006 |
| JP | 2009-111214 | 5/2009 |
| JP | 2011-035371 | 2/2011 |

OTHER PUBLICATIONS

Yamaguchi et al.; "Low-Resistive and Homogenous NIPT-Silicide Formation Using Ultra-Low Temperature Annealing With Microwave System for 22NM-Node CMOS and Beyond", IEDM Tech. Dig., pp. 576-579, (2010).

* cited by examiner

*Primary Examiner* — Zandra Smith
*Assistant Examiner* — Khanh Duong
(74) *Attorney, Agent, or Firm* — Finnegan, Henderson, Farabow, Garrett & Dunner, L.L.P.

(57) ABSTRACT

According to one embodiment, a method of manufacturing a semiconductor device includes forming a gate electrode on a channel region in a silicon substrate via a gate insulation film; forming a source region and a drain region in the silicon substrate so as to sandwich the channel region along a channel direction by injecting desired impurities to the silicon substrate; forming amorphous regions containing the impurities on surfaces of the source region and the drain region by amorphousizing the surfaces of the source region and the drain region; forming nickel films on the amorphous regions; and forming crystal layers containing the activated impurities and forming nickel silicide films on the crystal layers at low temperature by radiating microwaves to the amorphous regions and the nickel films.

19 Claims, 14 Drawing Sheets

METHOD OF MANUFACTURING SEMICONDUCTOR DEVICE

CROSS-REFERENCE TO RELATED APPLICATION

This application is based upon and claims the benefit of priority from prior Japanese Patent Application No. 2011-158052 filed on Jul. 19, 2011, the entire contents of which are incorporated herein by reference.

FIELD

Embodiments of the invention relate to a method of manufacturing a semiconductor device.

BACKGROUND

Conventionally, although transistors are miniaturized mainly by a logic device, in memory devices which are miniaturized by one generation about every two years, transistors having a performance higher than the logic device have been requested.

In miniaturized transistors, a thin source/drain region such as, for example, a source/drain region having a thickness of 10 nm or less is formed. Even in the transistors, since it is necessary to reduce a parasitic resistance of the transistors, a nickel silicide film is formed on the source/drain region by self-alignment, and a resistance of the source/drain region is reduced by the nickel silicide films.

DETAILED DESCRIPTION

In one embodiment, a method of manufacturing a semiconductor device includes forming a gate electrode on a channel region in a silicon substrate via a gate insulation film; forming a source region and a drain region in the silicon substrate so as to sandwich the channel region along a channel direction by injecting desired impurities to the silicon substrate; forming amorphous regions containing the impurities on surfaces of the source region and the drain region by amorphousizing the surfaces of the source region and the drain region; forming nickel films on the amorphous regions; and forming crystal layers containing the activated impurities and forming nickel silicide films on the crystal layers by radiating microwaves to the amorphous regions and the nickel films.

Embodiments will be explained below referring to the drawings. However, the invention is not limited to the embodiments. Note that, portions common throughout all the drawings are denoted by common reference numerals and a duplicate explanation will not be repeated. Further, the drawings are schematic views which assist explanation and understanding of the invention, and although some portions of the drawings may have a shape, a size, a ratio, and the like different from those of an actual apparatus, they can be appropriately changed in design in consideration of the following explanation and a known technology.

(First Embodiment)

A method of manufacturing a first embodiment will be explained using FIGS. 1A to 1D. FIGS. 1A to 1D correspond to a cross-section of a MOSFET (Metal Oxide Semiconductor Field Effect Transistor) along a channel direction and shows manufacturing steps of the MOSFET disposed on a silicon substrate 101. In the respective drawings, a left side is a P-type MOSFET region 10 where a P-type MOSFET is formed, and a right side is an N-type MOSFET region 11 where an N-type MOSFET is formed. Here, although a method of manufacturing the MOSFET is explained as an example, the invention is not limited to the method of manufacturing the semiconductor device and may be a method of manufacturing other semiconductor device.

First, by a known method, a gate insulation film 105, which is composed of a silicon oxide film ($SiO_2$), a hafnium silicon oxide nitride film (HfSiON), and the like, is formed on each of a channel region of an N-type diffusion layer 103 in the P-type MOSFET region 10 and a channel region of a P-type diffusion layer 104 in the N-type MOSFET region 11 on the silicon substrate 101 with STIs (Shallow Trench Isolation) 102. Next, a metal film 106 which controls a work function of TiN and the like and a polycrystalline silicon film 107 are deposited on each of the gate insulation films 105, and these films are processed as gate electrodes 12. Further, extension diffusion layers 108, 109 are formed by injecting impurities to two portions of a front surface of the silicon substrate 101 that sandwiches the respective channel regions along the channel direction. Particularly, the P-type extension diffusion layer 108 is formed in the P-type MOSFET region 10, and the N-type extension diffusion layer 109 is formed in the N-type MOSFET region 11. Then, gate side wall films 110, which are composed of, for example, a silicon oxide film and a silicon nitride film (SiN) or a laminated structure of these films and cover side walls of the gate electrodes 12 are formed. Next, impurities are injected to the N-type the diffusion layer 103 and the P-type diffusion layer 104 via the extension diffusion layers 108, 109 using the gate electrodes 12 and the gate side wall films 110 as masks. As described above, as shown in FIG. 1A, a source/drain region 111 that is a P-type layer is formed in the P-type MOSFET region 10, and a source/drain region 112 that is an N-type layer is formed in the N-type MOSFET region 11. Here, for the purpose of simplification, an explanation as to Halo ion implantation and PTS (Punch Through Stopper) injection that are ordinarily executed when the MOSFET is formed is omitted.

Figure 1A:
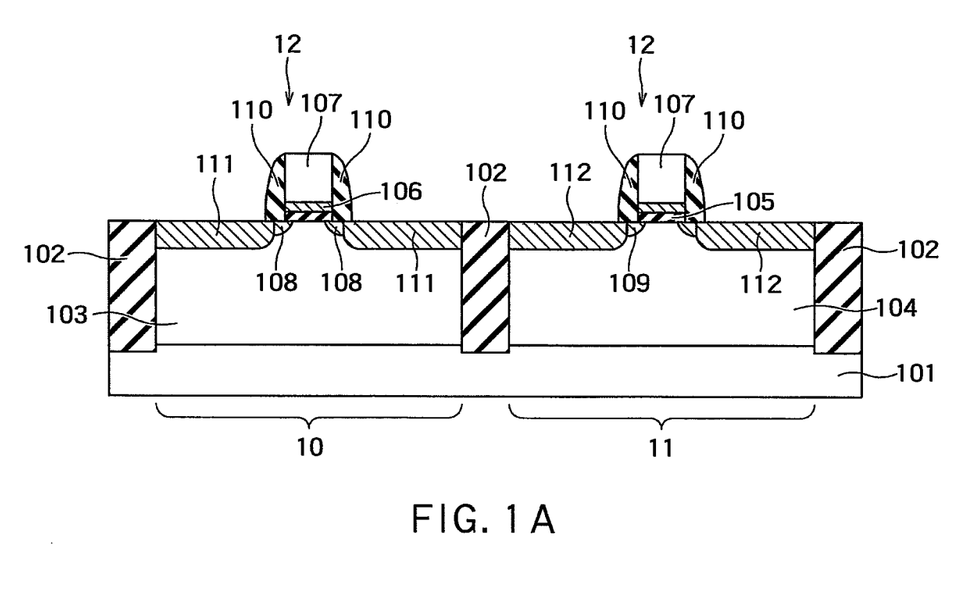
FIGS. 1A to 1D are views which explain a method of manufacturing a semiconductor device according to a first embodiment.

In the above explanation, although the source/drain regions 111, 112 having a depth of 10 nm is formed after the extension diffusion layers 108, 109 having a depth of, for example, 6 nm from the front surface of the silicon substrate 101 are formed. However, the present embodiment is not limited thereto and, for example, the side walls 110 are removed after the source/drain regions 111, 112 having a depth of 10 nm are formed, and then the extension diffusion layers 108, 109 having a depth of 6 nm may be formed and thereafter the side walls 110 may be formed again.

Figure 1B:
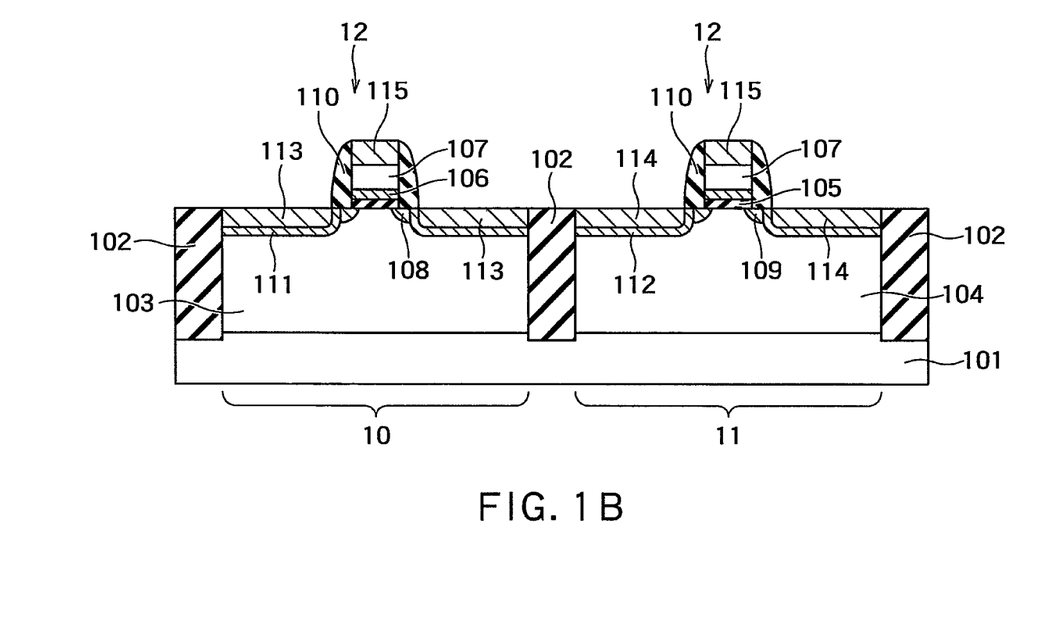

Next, as shown in FIG. 1B, amorphous regions 113, 114, 115 are formed on upper surfaces of the source/drain regions 111, 112 and on upper surfaces of polycrystalline silicon films 107 that constitute parts of the gate electrodes 12 by executing a plasma process in an atmosphere of Xe, Kr, Ar, GeH$_4$ and the like while applying a bias to the silicon substrate 101. Crystal defects can be reduced by using the plasma process as described above. At the time, it is preferable to form a depth of the amorphous regions 113, 114 formed on the upper surfaces of the source/drain regions 111, 112 so that the depth does not exceed the depth of the source/drain regions 111, 112.

Figure 1C:
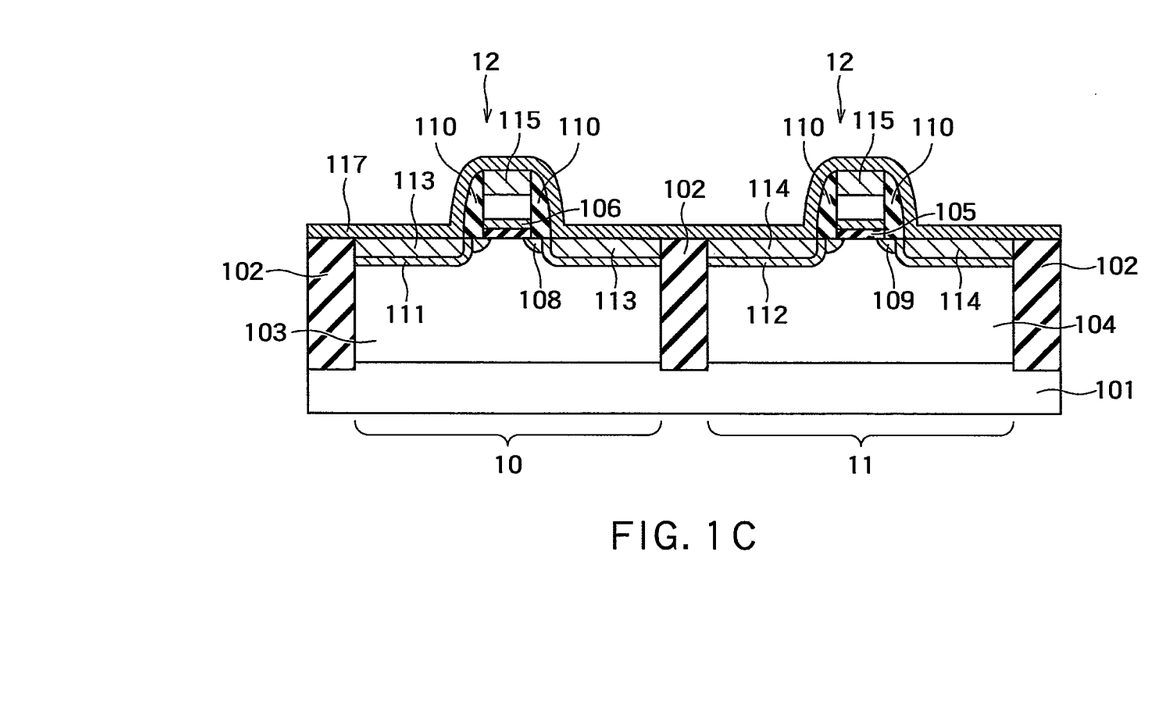

As shown in FIG. 1C, a nickel film 117 containing 5 to 10% of platinum and having a thickness of 5 to 7 nm is deposited on the silicon substrate 101, in particular, so as to cover the source/drain regions 111, 112 and the gate electrodes 12 using PVD (Physical Vapor Deposition). At the time, the nickel film 117 can be formed also using CVD (Chemical Vapor Deposition). Note that the nickel film 117 may contain impurities such as cobalt to improve a heat resistance, a resistance value, and the like or may not contain the impurities.

Next, in an atmosphere containing N$_2$, Ar, and the like, microwaves of 5.80 GHz are radiated at a power of 10 W/cm$^2$ to 1000 W/cm$^2$. Particularly, the microwaves are radiated for 30 seconds to 15 minutes at a power by which a substrate temperature of the silicon substrate 101 is saturated at 150 to 350° C. and preferably at 200 to 300° C. As described above, upper portions of the amorphous regions 113, 114, 115 in contact with the nickel film 117 and the nickel film 117 cause a silicidation reaction, and nickel silicide films 118, 119 are formed on the upper surfaces of the source/drain regions 111, 112 and on upper surfaces of the polycrystalline silicon films 107. Almost all the nickel silicide films 118, 119 are formed as films composed of a low resistant nickel monosilicide (NiSi) by causing the reaction at a low temperature using the microwaves as described above. Then, at the same time, lower portions of the amorphous regions 113, 114 in contact with the source/drain regions 111, 112 are crystalized (solid-phase grown) using the source/drain regions 111, 112 as a growth nucleus, and impurities contained in the amorphous regions 113, 114 are activated. That is, the lower portions of the amorphous regions 113, 114 in contact with the source/drain regions 111, 112 are made to single crystal layers containing the activated impurities by radiating the microwaves, and further the nickel silicide films 118 are formed on the single crystal layers. The single crystal layers have a crystal orientation in accordance with a crystal structure of the source/drain regions 111, 112. Further, the nickel silicide films 118 do not pass through the source/drain regions 111, 112, in other words, the nickel silicide films 118 are formed on lower surfaces of the amorphous regions in contact with the source/drain regions 111, 112 (in FIG. 1, on an upper side, that is, on the nickel film 117 side). Note that the substrate temperature of the silicon substrate 101 at the time can be confirmed using a thermocouple disposed on a back surface of the silicon substrate 101 or a radiation thermometer installed to a microwave radiation apparatus.

Figure 2:
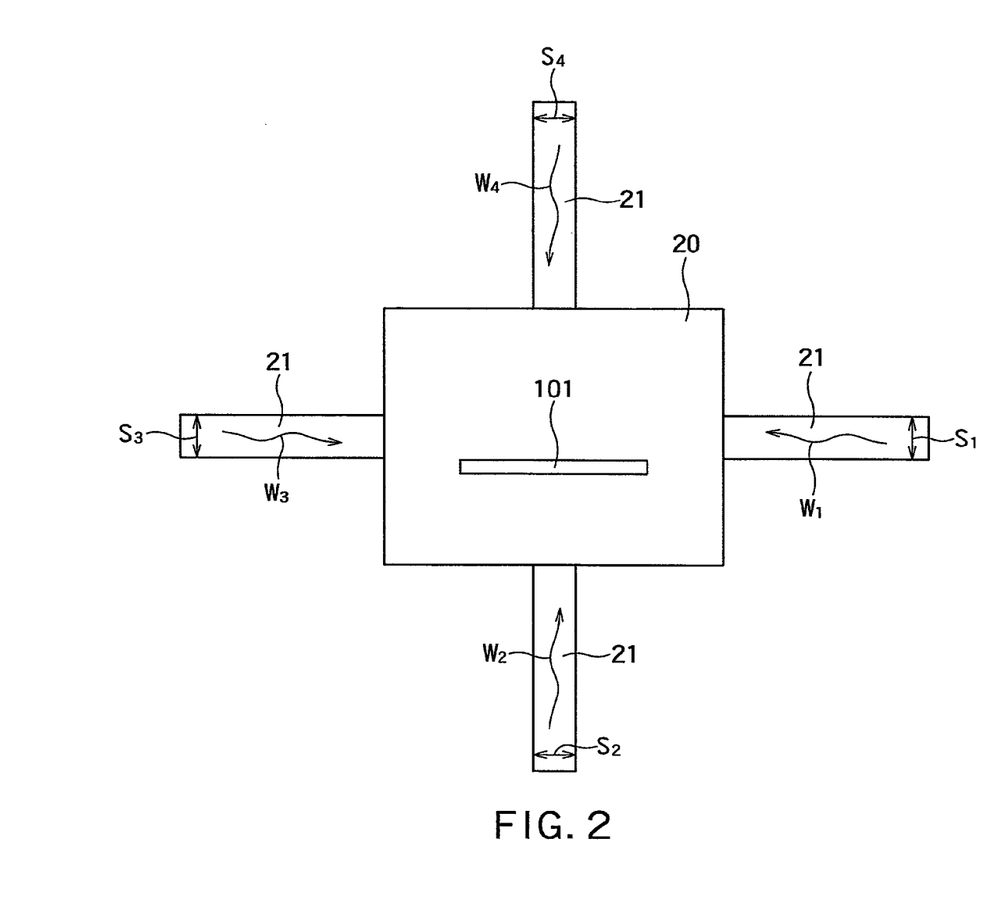
FIG. 2 is a view schematically showing a manufacturing apparatus of the first embodiment and a second embodiment.

More particularly, a radiation power of the microwaves is preferably configured as described below. As shown in FIG. 2, a manufacturing apparatus 20 used when the microwaves are radiated has one or plural waveguides 21 (for example, in FIG. 2, the manufacturing apparatus 20 has four waveguides 21). The waveguides 21 are used to guide the microwaves Wn (in FIG. 2, W$_1$ to W$_4$) output from a microwave oscillator (not illustrated) such as a magnetron into the manufacturing apparatus 20 to which the silicon substrate 101 is installed. Then, it is preferable to adjust the sum total $\Sigma$ (PWn/Sn) of quotients obtained by dividing radiation powers of the microwaves, in particular, powers PWn of respective microwaves Wn output from the respective waveguides 21 by cross-sectional areas Sn of the waveguides 21 corresponding to the powers PWn so that the sum total $\Sigma$ (PWn/Sn) becomes 10 W/cm$^2$ to 1000 W/cm$^2$. This will be explained using, for example, the manufacturing apparatus 20 having the four waveguides 21 shown in FIG. 2. When the sectional areas of the respective waveguides 21 are shown by S$_1$ to S$_4$ and the powers of the microwaves W$_1$ to W$_4$ output from the respective waveguides 21 are shown by PW$_1$ to PW$_4$, it is preferable to adjust radiation powers of the microwaves so that the sum total of quotients (PW$_{1-4}$/S$_{1-4}$) obtained by dividing the powers of the microwaves output from the respective waveguide 21 by the sectional areas of the respective waveguides 21, that is, PW$_1$/S$_1$+PW$_2$/S$_2$+PW$_3$/S$_3$+PW$_4$/S$_4$ becomes 10 W/cm$^2$ to 1000 W/cm$^2$. Accordingly, the radiation powers of the microwaves defined as described above increase as the number of the waveguides 21 provided with the increase of the manufacturing apparatus 20.

Further, in the present embodiment, although the microwaves that mainly have a frequency band of 5.80 GHz are used, this is because that since the frequency band is designated to ISM (Industry-Science-Medical Band), the magnetron can easily obtain the microwaves, and the present embodiment can be embodied likewise even by microwaves that mainly have a frequency band of from 2.45 GHz to 25 GHz.

Further, when the nickel silicide films 118, 119 are formed by radiating the microwaves, an increase of the substrate temperature may be suppressed by cooling the silicon substrate 101 by blowing N$_2$ gas, He gas, and the like to the substrate or placing the silicon substrate 101 on a quartz plate simultaneously with the radiation of the microwaves. As described above, the radiation powers of the microwaves can be more increased by suppressing the increase of the substrate temperature of the silicon substrate 101 and thereby the silicidation reaction and the activation of the impurities can be easily executed.

Figure 1D:
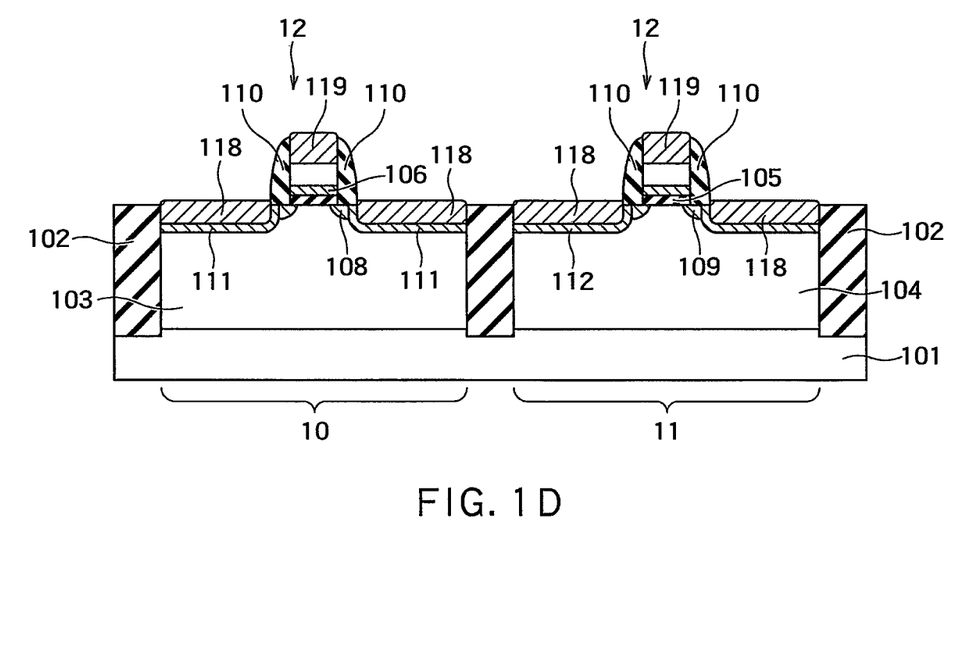

Next, when the unreacted nickel film 117 is etched and removed by aqua regina and the like, as shown in FIG. 1D, the nickel silicide films 118, 119 remain on the upper surfaces of the source/drain regions 111, 112 and on the upper surfaces of the polycrystalline silicon films 107.

Incidentally, when a nickel silicide film is formed by a conventionally used RTA (Rapid Thermal annealing), a temperature of about 300° C. to 500° C. is necessary. However, at the temperature, it is difficult to crystallize an amorphous region as well as to activate impurities contained in the amorphous region. To cope with the problem, although it is also possible to satisfy both the crystallization and the activation at the same time by setting a higher temperature, at the time, it is difficult to obtain a nickel silicide film having a thin thickness and a low resistance.

Further, when a very thin nickel silicide film is formed on the source/drain regions by RTA, since the nickel silicide films are very thin, aggregation occurs by heat applied after the nickel silicide films are formed and a sheet resistance of the nickel silicide films increases. In contrast, when a thick nickel silicide film is formed on the source/drain regions by RTA, there is a possibility that the nickel silicide film causes an abnormal growth and the like toward a depth direction (toward a direction opposite to the front surface of the silicon substrate), further passes through the source/drain regions, and increases a junction leak.

However, according to the present embodiment, the abnormal growth of the nickel silicide films 118, 119 as described above can be avoided by using the microwaves. The microwaves have such a property that they have a long wavelength of about 5 cm in comparison with ultraviolet rays, visible light, infrared rays, and the like and a high permeability into a film. In the present embodiment, both the formation of the nickel silicide films 118, 119 and the activation of the impurities contained in the source/drain regions 111, 112 can be executed while suppressing the aggregation and the abnormal growth due to the heat by that the microwaves having the property deliver energy to necessary portions and dipoles existing in an interface between the nickel film 117 and the amorphous regions 113, 114, 115 are rotated. Further, in the RTA and the like, even in a low temperature region in which nickel rich silicide is formed, since the nickel silicide films 118, 119 that contain a lot of nickel monosilicide and have a low resistance can be formed by radiating the microwaves, a parasitic resistance of a transistor can be more reduced.

Further, according to the present embodiment, and it can be avoided that the nickel silicide films 118 pass through the source/drain regions 111, 112 by suppressing the abnormal growth of the nickel silicide films 118. That is, the nickel silicide films 118 can be formed thin. Accordingly, a transistor in which a junction leak current is suppressed can be formed. For example, smooth nickel silicide films 118 can be obtained in which an interface between the nickel silicide films 118 and the source/drain regions 111, 112 have a roughness of 1 nm or less.

As to the mechanism, the inventors have the following understanding. This will be explained below using FIGS. 3A to 3E. FIGS. 3A to 3E correspond to FIGS. 1C to 1D and show a process in which an amorphous region 203 (113, 114, 115 in FIGS. 1C and 1D) and a nickel film 204 (117 in FIGS. 1C and 1D) cause a silicidation reaction and a nickel silicide film 205 (118, 119 in FIGS. 1C and 1D) is formed.

Figure 3A:
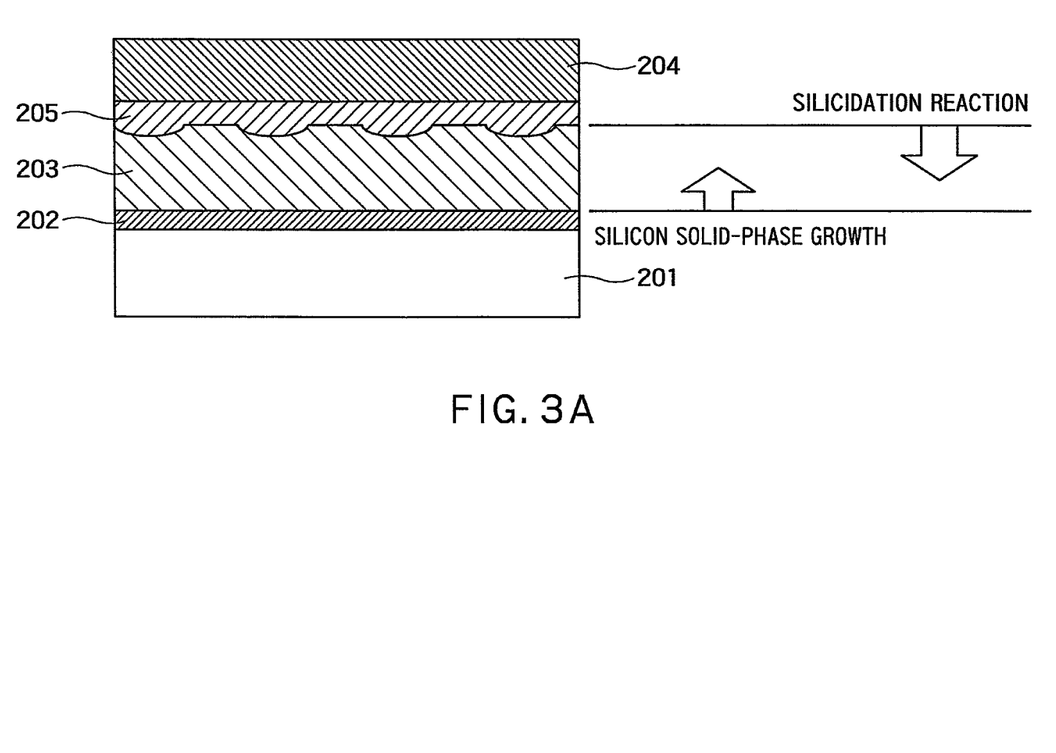
FIGS. 3A to 3E are views which explain a mechanism in the first and second embodiments.

First, as shown in FIG. 3A, the nickel film 204 causes the silicidation reaction with a part of the amorphous region 203 by radiating the microwaves. The silicidation reaction proceeds in a depth direction (toward a silicon substrate 201). Further, at the same time, a crystallization of amorphous silicon, that is, a solid-phase growth of silicon using the silicon substrate 201 as a growth nucleus (seed) proceeds in a direction opposite to a direction in which the silicidation reaction proceeds, and a part of the amorphous region 203 becomes a single crystal layer 202.

Figure 3B:
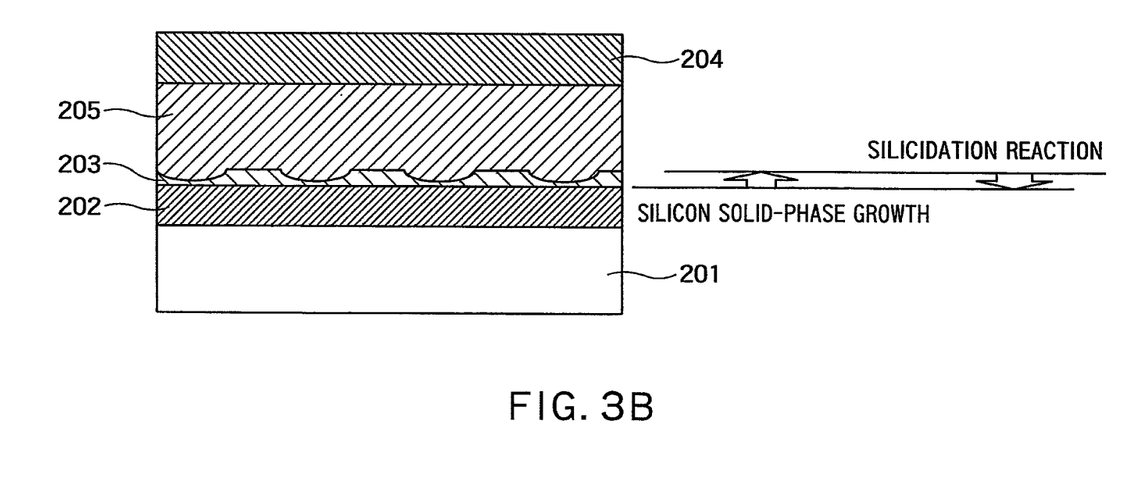
Figure 3C:
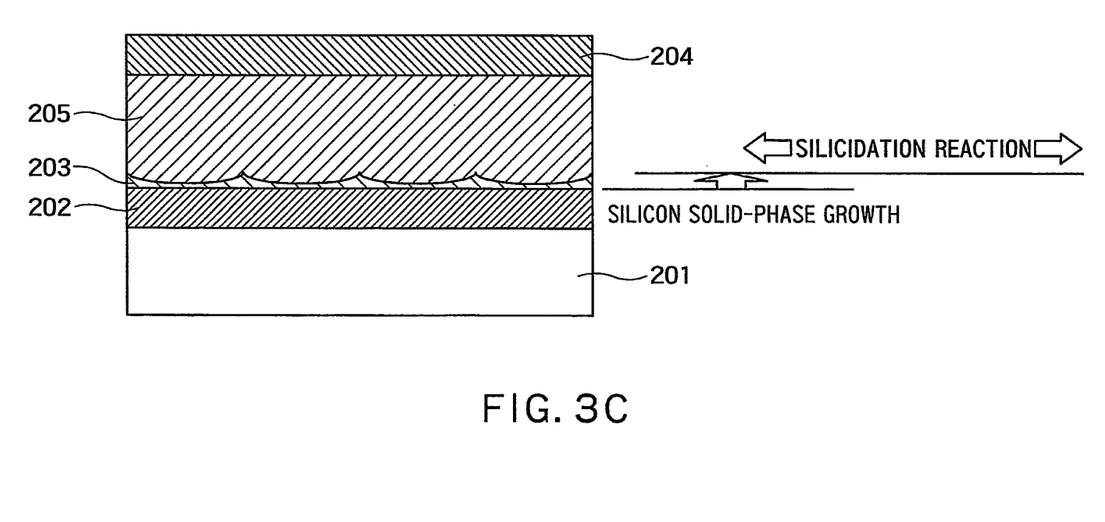

Then, as shown in FIG. 3B, it is considered that the silicidation reaction stops once in an interface between the amorphous region 203 and the single crystal layer 202 due to solid-phase growth. Particularly, when the microwaves are used at about 200° C., although a speed of the silicidation reaction is faster than a speed of the solid-phase growth, the silicidation reaction in the depth direction stops once in the interface between the single crystal layer 202 and the amorphous region 203, and further, as shown in FIG. 3C, the silicidation reaction proceeds in a lateral direction along the interface. Then, as shown in FIG. 3D, when the silicidation in the amorphous region 203 in the lateral direction is completed, the silicidation reaction in the depth direction resumes as shown in FIG. 3E.

Figure 3D:
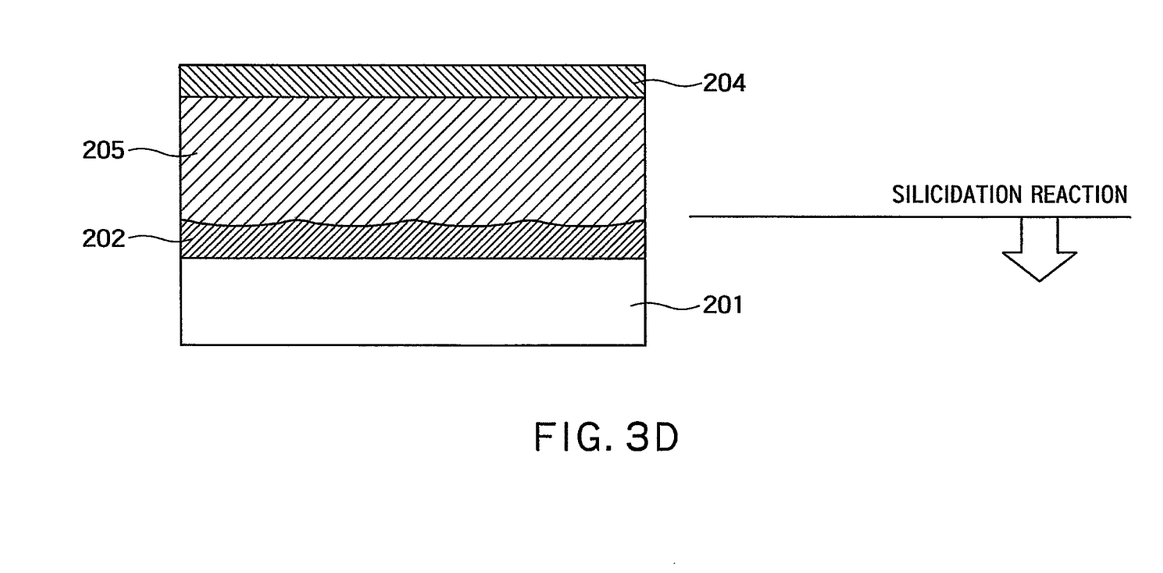
Figure 3E:
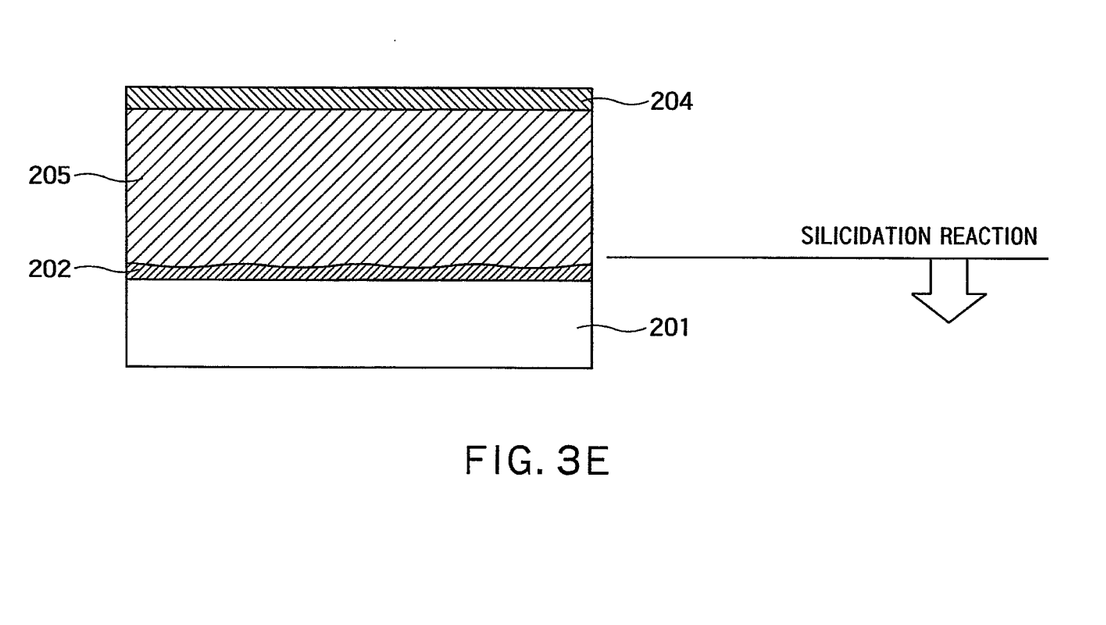

In the present embodiment shown in FIGS. 1C and 1D, since the nickel silicide films 118 are formed on a front surface side of the silicon substrate 101 rather than bottom portions of the source/drain regions 111, 112 positioned far from the front surface of the silicon substrate 101 by finishing the silicidation reaction at a stage that the silicidation reaction in the lateral direction as in FIG. 3D is completed, it can be avoided that the nickel silicide films 118 pass through the source/drain regions 111, 112 and thereby the transistor in which the junction leak current is sufficiently suppressed can be formed.

Note that, although not described in the explanation of the present embodiment, even when Si, SiGe, and the like are selectively epitaxially grown to the source/drain regions 111, 112, the present embodiment can be applied.

Figure 4:
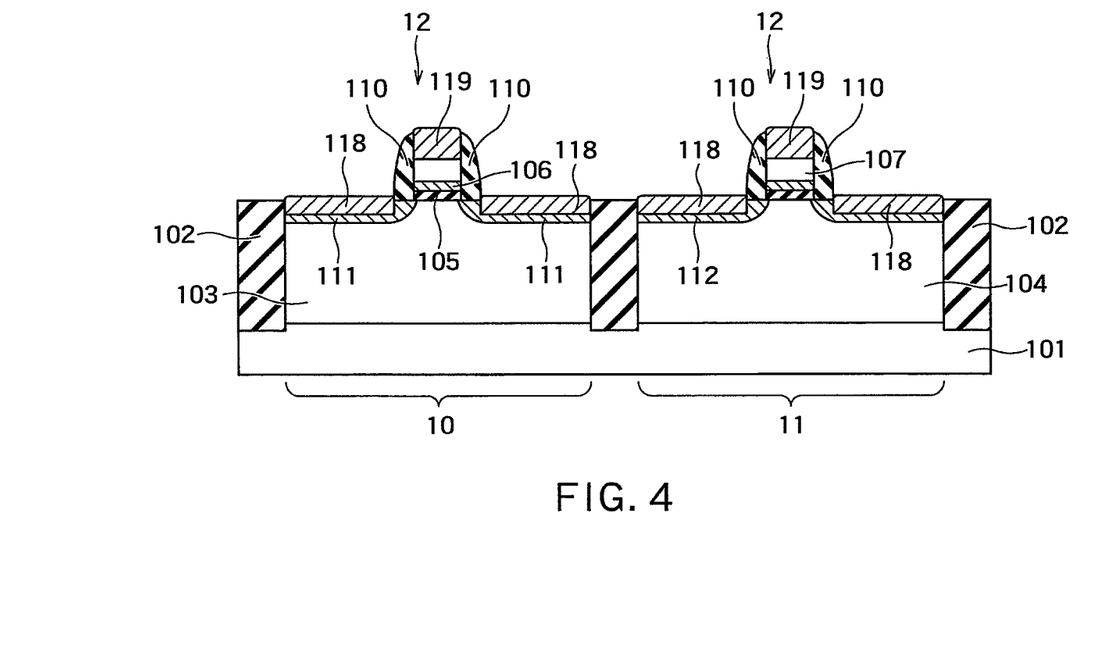
FIG. 4 is a sectional view of a semiconductor device according to a modification of the first embodiment.

Further, the present embodiment can be applied to a structure without the extension diffusion layers 108, 109 as shown in FIG. 4.

(Second Embodiment)

A method of manufacturing a Fin-type transistor (FinFET) according to a second embodiment will be explained using FIGS. 5A to 5E. The FinFET is a MOSFET configured such that a projection-like region is formed by cutting a silicon substrate in a thin strip state (the projection-like region is called a Fin), and a gate electrode is caused to three-dimensionally intersect with the projection-like region and thereby an upper surface and a side surface of the cut projection-like region is used as a channel. Here, although a method of manufacturing an N-type FinFET will be explained, the invention is not limited to the method of manufacturing the semiconductor device and may be a method of manufacturing other semiconductor device and a P-type Fin FET.

FIGS. 5A to 5E correspond to a cross-section of a Fin in a source/drain region (not illustrated) in the Fin in a FinFET and shows manufacturing steps of a P-type FinFET. Note that, although not shown in FIGS. 5A to 5E, the FinFET may include an extension diffusion layer, and a gate side wall film.

Figure 5A:
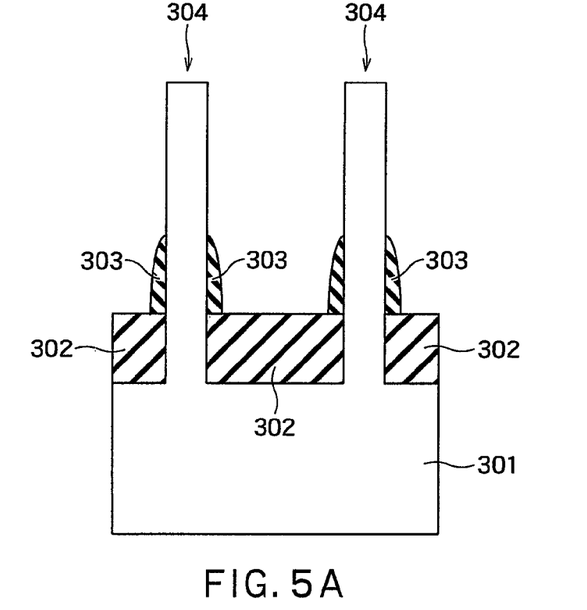
FIGS. 5A to 5E are views which explain a method of manufacturing a semiconductor device according to the second embodiment.

First, a silicon substrate 301, on which plural Fins 304 having a width of, for example, 12 nm are formed, is prepared, and an STI 302 is formed by burying an insulation film between the Fins 304. Further, after side wall films 303 are formed so as to cover the Fins 304, the side wall films 303 that cover upper portions of the Fins 304 are removed by reactive Ion etching. As described above, the Fins 304 whose lower portions are covered with the side wall films 303 and whose upper portions are exposed are formed as shown in FIG. 5A are formed.

Figure 5B:
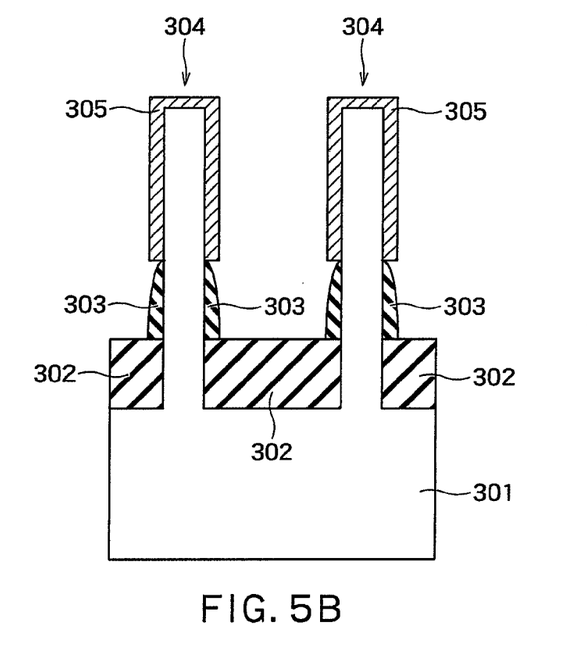

Next, as shown in FIG. 5B, natural oxide films that exist on front surfaces of exposed upper portions of the Fins 304 are removed, and epitaxial silicon layers 305 having a thickness of, for example, 9 nm are selectively grown to the portions where the Fins 304 are exposed. The epitaxial silicon layers 305 that have a uniform crystal are formed.

Figure 5C:
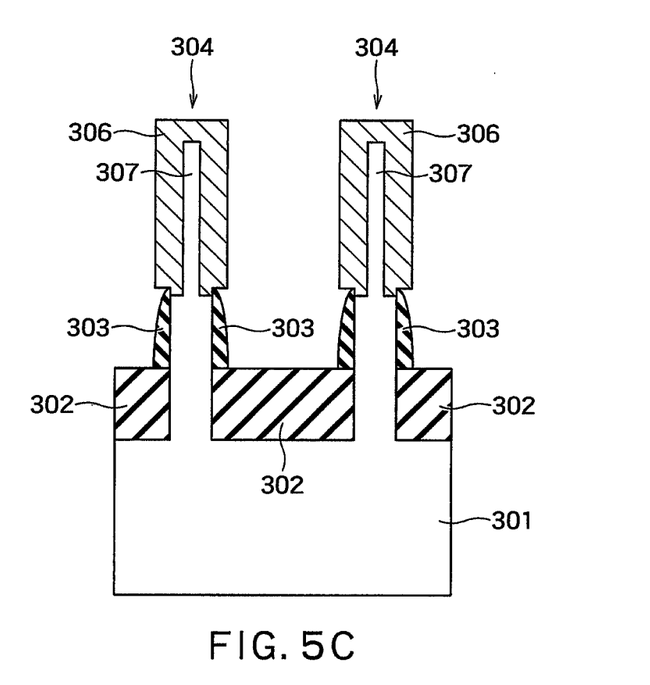

Next, as shown in FIG. 5C, amorphous regions 306 containing phosphorus (P) are formed on the front surfaces of the Fins 304 on which the epitaxial silicon layers 305 are formed by using a plasma doping process in an atmosphere containing a doping gas such as $PH_3$ and an inert gas such as He, Ne, Ar, Kr, and Xe. At the time, impurities are doped at the same time. In the case, a thickness of the amorphous regions 306 is preferably made to, for example, 10 nm so that single crystal portions 307 remain to central portions of the Fins 304. This is because when all of the Fins 304 are amorphousized, it becomes difficult to execute recrystallization at a next step. Further, the number of crystal defects can be reduced by executing doping by plasma having a smaller amount of energy of particles than ion implantation. In addition, since the doping can be executed in a shallow and wide area, the plasma doping process is preferably used to the three-dimensional structure such as the Fins 304.

Figure 5D:
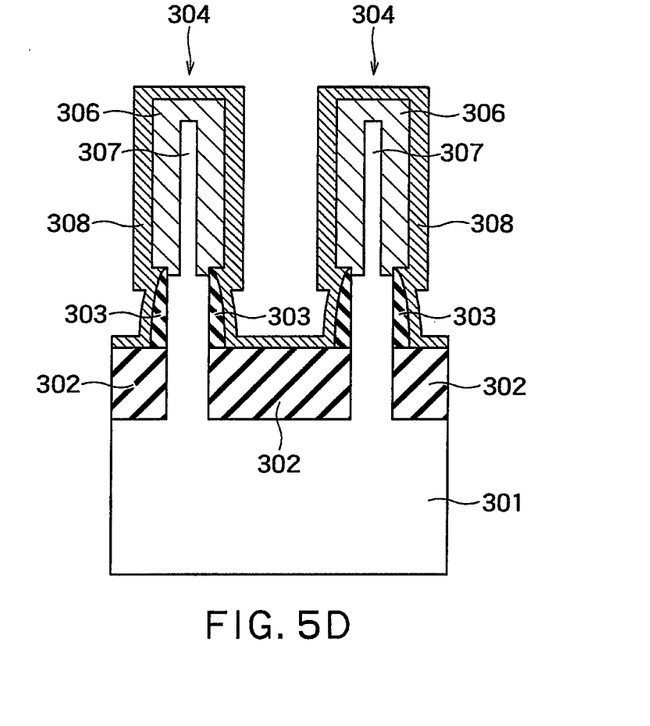

Next, as shown in FIG. 5D, nickel films 308 containing 5 to 40% of cobalt are deposited in a thickness of 5 to 7 nm on the silicon substrate 301 by CVD, in particular, so as to cover the Fins 304. To form the nickel films 308 so as to cover the Fins 304 that have a miniature structure, it is preferable to use CVD. However, when CVD is used, since an organic source is used, impurities such as carbon are liable to be contained in the nickel films 308. Accordingly, to remove the impurities such as the carbon, hydrogen is preferably used at a next step. Further, in the present embodiment, although the nickel films 308 containing cobalt are used, the nickel films 308 may or may not contain impurities such as phosphorus.

Next, microwaves of 5.80 GHz are radiated at a power of 10 W/cm$^2$ to 1000 W/cm$^2$ in an atmosphere containing H$_2$, N$_2$, or Ar. Particularly, the microwaves are radiated for 30 seconds to 15 minutes at a power by which a substrate temperature of the silicon substrate 301 is saturated at 200 to 350° C. and preferably at 250 to 300° C. Note that the substrate temperature of the silicon substrate 301 at the time can be confirmed using a thermocouple disposed on a back surface of the silicon substrate 301 like the first embodiment.

Outer peripheries of the amorphous regions 306 in contact with the nickel films 308 and the nickel films 308 cause a silicidation reaction and nickel silicide films 309 that cover the upper portions of the Fins 304 are formed by radiating the microwaves as described above. Almost all the nickel silicide films 309 are formed as films composed of a low resistant nickel monosilicide (NiSi) by causing the reaction at a low temperature using the microwaves. Further, the nickel silicide films 309 do not pass through central portions of the Fins 304. Then, at the same time, central portions of the amorphous regions 306 in contact with the single crystal portions 307 of central portions of the Fins 304 are crystallized (solid-phase grown) using the single crystal portions 307 of the central portions of the Fins 304 as a growth nucleus, and impurities contained in the central portions of the amorphous regions 306 are activated. That is, like the mechanism of the first embodiment explained previously using FIGS. 3A to 3E, on side walls and upper surfaces of a three-dimensional structure of the Fins 304, simultaneously with the silicidation reaction of the amorphous regions 306 and the nickel films 308, the single crystal portions 307 existing in the central portions of the Fins 304 act as a growth nucleus (seed) for recrystallization, the amorphous regions 306 are solid-phase grown and crystal layers are formed thereby, and impurities contained in the crystal layers are activated. Accordingly, like the first embodiment, it can be avoided that the nickel silicide films 309 pass through source/drain regions (not illustrated) by suppressing an abnormal growth of the nickel silicide films 309.

Note that also in the present embodiment, the same definition of a radiation power of the microwaves as that of the first embodiment is used, and further, as to also a frequency, like the first embodiment, the present embodiment can also be embodied by microwaves having a frequency band of mainly from 2.45 GHz to 25 GHz.

Further, when the nickel silicide films 309 are formed by radiating the microwaves, like the first embodiment, an increase of the substrate temperature may be suppressed by cooling the silicon substrate 301 by blowing N$_2$ gas, He gas, and the like to the substrate or placing the silicon substrate 301 on a quartz plate simultaneously with the radiation of the microwaves.

Figure 5E:
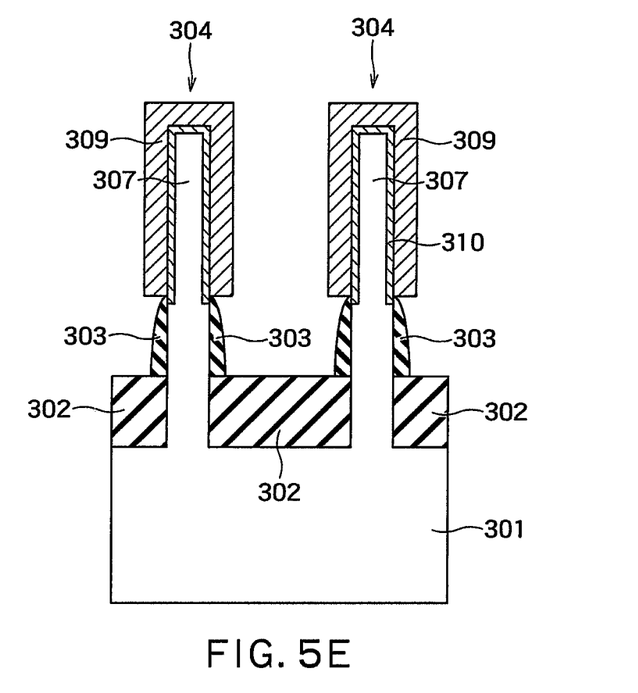

Next, when unreacted nickel films 308 are etched and removed by a mixed liquid of sulfuric acid and hydrogen peroxide water, and the like, the Fins 304 that have the nickel silicide films 309 on diffusion layers 310 as shown in FIG. 5E can be obtained. A film thickness of the nickel silicide films 309 is, for example, 7 to 8 nm.

According to the present embodiment, like the first embodiment, both the formation of the nickel silicide films 309 and the activation of the impurities can be executed at the same time while suppressing aggregation and abnormal growth due to heat by using the microwaves. Further, since the formation and the activation can be executed at a low temperature, the nickel silicide films 309 that contain nickel monosilicide in a large amount and a low resistance can be formed and thereby a parasitic resistance of a transistor can be reduced. In addition, there can be formed a transistor in which the abnormal growth of the nickel silicide films 309 is suppressed and it is avoided that nickel silicide films 309 pass through the source/drain regions and thereby a junction leak current is sufficiently suppressed.

Note that, in the present embodiment, although the explanation is made as to the N-type FinFET, as also described previously, the present embodiment can be applied also to the P-type FinFET, and, in the case, it is sufficient to change the doping gas used in the plasma doping process from PH$_3$ and the like to B$_2$H$_6$ and the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device comprises:
    forming a gate electrode on a channel region in a silicon substrate via a gate insulation film;
    forming a source region and a drain region in the silicon substrate so as to sandwich the channel region along a channel direction by injecting desired impurities to the silicon substrate;
    forming amorphous regions containing the impurities on surfaces of the source region and the drain region by amorphousizing the surfaces of the source region and the drain region;
    forming nickel films on the amorphous regions; and
    forming crystal layers containing the activated impurities and forming nickel silicide films on the crystal layers by radiating microwaves to the amorphous regions and the nickel films.

2. The method of manufacturing the semiconductor device according to claim 1, wherein the microwaves are radiated so that a substrate temperature of the silicon substrate becomes from 150° C. to 350° C.

3. The method of manufacturing the semiconductor device according to claim 1, wherein the microwaves are radiated while the silicon substrate is cooled.

4. The method of manufacturing the semiconductor device according to claim 1, wherein the amorphous regions are formed by a plasma process.

5. The method of manufacturing the semiconductor device according to claim 1, wherein the nickel silicide films are formed by radiating the microwaves and causing upper portions of the amorphous regions in contact with the nickel films to react with the nickel films.

6. The method of manufacturing the semiconductor device according to claim 1, wherein the nickel silicide films are formed above lower surfaces of the amorphous regions in contact with the source regions and the drain regions.

7. The method of manufacturing the semiconductor device according to claim 1, wherein the nickel silicide films comprise nickel monosilicide.

8. The method of manufacturing the semiconductor device according to claim 1, wherein the nickel films contain platinum or cobalt.

9. The method of manufacturing the semiconductor device according to claim 1, wherein the crystal layers are formed by radiating the microwaves and causing solid-phase grown from lower portions of the amorphous regions to upper portions of the amorphous regions, the lower portions of the amorphous regions being in contact with the source region and the drain region.

10. The method of manufacturing the semiconductor device according to claim 9, wherein the crystal layers are formed using the source region and the drain region in contact with lower portions of the amorphous regions as a growth nucleus.

11. The method of manufacturing the semiconductor device according to claim 1, wherein the microwaves have a frequency of between 2.45 GHz and 25 GHz.

12. The method of manufacturing the semiconductor device according to claim 1, wherein a power density of the microwaves is between from 10 W/cm$^2$ to 1 k W/cm$^2$.

13. A method of manufacturing a semiconductor device comprises:
   forming a plurality of Fins on a silicon substrate;
   forming epitaxial layers so as to cover upper surfaces of the Fins;
   forming amorphous regions by amorphousizing the epitaxial layers using plasma doping as well as injecting impurities to the amorphous regions;
   forming nickel films so as to cover surfaces of the amorphous regions; and
   forming crystal layers containing the activated impurities and forming nickel silicide films on the crystal layers by radiating microwaves to the amorphous regions and the nickel films.

14. The method of manufacturing the semiconductor device according to claim 13, wherein the microwaves are radiated so that a substrate temperature of the silicon substrate becomes from 150° C. to 350° C.

15. The method of manufacturing the semiconductor device according to claim 13, wherein the microwaves are radiated while the silicon substrate is cooled.

16. The method of manufacturing the semiconductor device according to claim 13, wherein the nickel silicide films are formed by radiating with the microwaves and causing outer peripheries of the amorphous regions in contact with the nickel films to react with the nickel films.

17. The method of manufacturing the semiconductor device according to claim 13, wherein the nickel silicide films comprise nickel monosilicide.

18. The method of manufacturing the semiconductor device according to claim 13, wherein the nickel films contain cobalt or phosphorus.

19. The method of manufacturing the semiconductor device according to claim 13, wherein the crystal layers are formed by radiating with the microwaves and causing solid-phase grown from central portions of the amorphous regions to lower portions of the amorphous regions, the central portions of the amorphous regions being in contact with the Fins.

* * * * *